(12) United States Patent
Diefenbeck et al.

(10) Patent No.: US 6,888,226 B2
(45) Date of Patent: May 3, 2005

(54) SEMICONDUCTOR STRUCTURE AND METHOD FOR IMPROVING ITS ABILITY TO WITHSTAND ELECTROSTATIC DISCHARGE (ESD) AND OVERLOADS

(75) Inventors: Klaus Diefenbeck, Munich (DE); Christian Herzum, Poecking (DE); Jakob Huber, Beyharting (DE); Karlheinz Müller, Velden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/479,267

(22) PCT Filed: May 24, 2002

(86) PCT No.: PCT/EP02/05732
§ 371 (c)(1),
(2), (4) Date: May 26, 2004

(87) PCT Pub. No.: WO02/097897
PCT Pub. Date: Dec. 5, 2002

(65) Prior Publication Data
US 2004/0201044 A1 Oct. 14, 2004

(30) Foreign Application Priority Data
May 31, 2001 (DE) .......................................... 101 26 627

(51) Int. Cl.[7] ...................... H01L 29/167; H01L 21/331
(52) U.S. Cl. ........................ 257/657; 257/565; 257/591; 438/309; 438/328
(58) Field of Search ................................. 257/657, 565, 257/591, 592, 596, 288; 438/309, 328, 197, 514

(56) References Cited

U.S. PATENT DOCUMENTS 3,383,571 A * 5/1968 Turner et al. ............... 257/565
4,594,602 A * 6/1986 Iimura et al. ............... 257/657
5,581,104 A   12/1996 Lowrey et al.
6,232,822 B1   5/2001 Sakui et al.

FOREIGN PATENT DOCUMENTS

| DE | 100 02 241 A1 | 8/2001 |
| JP | 9-148338 | 6/1997 |
| JP | 10-172981 | 6/1998 |
| JP | 2000-58870 | 2/2000 |

OTHER PUBLICATIONS

Taur, Yuan, et al., "Fundamentals of Modern VLSI Devices", Cambridge University Press, 1998, pp. 320–325, (6 pages).

Betrand G. et al., "Analysis and Compact Modeling of a Vertical Grounded–Base NPN Bipolar Transistor Used as an ESD Protection in a Smart Power Technology", IEEE BCTM 1, 2, 2000, pp. 28–31, (4 pages).

Amerasekera A. et al., "ESD in Silicon Integrated Circuits", John Wiley & Sons, 1995, pp. 186–188, (3 pages).

* cited by examiner

Primary Examiner—Mark V. Prenty
(74) Attorney, Agent, or Firm—Maginot, Moore & Beck

(57) ABSTRACT

A semiconductor structure includes a base layer of a first conductivity type, a first layer of the first conductivity type arranged on the base layer and having a dopant concentration that is lower than a dopant concentration of the base layer, and a second layer of a second conductivity type being operative with the first layer in order to form a transition between the first conductivity type and the second conductivity type. A course of a dopant profile at the transition between the base layer and the first layer is set such that in an ESD case a space charge region shifted to the transition between the base layer and the first layer reaches into the base layer.

18 Claims, 5 Drawing Sheets

SEMICONDUCTOR STRUCTURE AND METHOD FOR IMPROVING ITS ABILITY TO WITHSTAND ELECTROSTATIC DISCHARGE (ESD) AND OVERLOADS

CROSS-REFERENCE TO RELATED APPLICATIONS

This application claims the benefit of PCT application no. PCT/EP02/05732, filed May 24, 2002.

BACKGROUND OF THE INVENTION

1. Field of the Invention

The present invention relates to a semiconductor structure, a method for improving its ESD strength and a method for improving its overload strength.

2. Description of the Prior Art

The present invention in particular relates to ESD endangered semiconductor devices (ESD=Electro Static Discharge). Such ESD endangered devices are in particular devices whose parasitic capacities are considerably smaller than the source capacities in an ESD test process. With the so-called human body model (HBM) the capacities lie in the range of about 100 pF. Among the relevant devices are high frequency diodes and high frequency bipolar transistors. With bipolar transistors either the emitter-base or the base-collector distance represents the weak point with regard to an ESD load depending on technology.

The present invention further particularly relates to semiconductor devices endangered by destruction through occurring overvoltages, wherein such overvoltage endangered devices, like also in the ESD case, e.g. include high frequency diodes and high frequency bipolar transistors. With a voltage or a current overload, e. g. caused by transitions or a faulty RF-adaption, the emitter-base distance or the base-emitter distance is mainly endangered, like in the ESD-case. They may break through, and an avalanche-like rising current may cause an irreversible damage of the device.

With the electronic devices, as they are manufactured and used today with always decreasing geometries with a simultaneous increase of integration density, there is a danger of damaging or destroying them due to the rising sensitivity in the case of electrostatic discharges. The devices have therefore to be protected against such electrostatic discharges, which can on the one hand be obtained by handling them accordingly in chip zones, which however only prevents the entering of the electrostatic discharge without the devices themselves comprising any protective measures.

Critical devices are frequently supported by external, additional components. In integrated circuits mainly diodes ("protection diode") in different versions are used herefore, often as a double diode in a "back to back" arrangement. Such a protective diode is e. g. connected against mass in parallel to the very sensitive gate contact of an MOS transistor. In case of an overvoltage it breaks through and therefore leads off the dangerous ESD charge to the mass.

With applications in the area of microns such protective elements are unwanted, however, as they massively affect the high frequency properties due to their parasitic capacities also in the reversing case. Apart from that, such external protective measures only operate restrictedly; in any case it is sensible to optimize the active device to an optimum ESD strength.

Apart from these "passive" protective measures approaches exist in the art aiming to distribute the current as far as possible when entering an ESD case. For this reason it is tried to reach a planar instead of a locally restricted breakthrough. To this end the design of the semiconductor device is rounded, as spherical dopant profiles occur in the corners which break through first. If cylindrical areas along the edges do not change into the breakthrough fast enough, this can lead to a thermal destruction of a semiconductor device. The disadvantage of these proceedings is, however, that the optimization is restricted to only surface-near parts of the semiconductor device.

In the following, the results of an ESD case are described in more detail using an exemplary semiconductor structure. In FIG. 1A a semiconductor structure is shown having a high-doped substrate 100, on which a first layer 102, e. g. an epitaxy layer has grown. As an example it is assumed that an additional layer 104 has grown on the epitaxy layer 102. The layers 102 and 104 are low-doped. The layers 102 and 104 are of the n-type, whereas the layer 104 is of the p-type, so that a pn-transition is formed at the interface between the first layer 102 and the second layer 104, which is poled in the reverse direction in FIG. 1A, as is schematically illustrated by the polarity applied to the terminals 106 and 108. In FIG. 1A the space charge region is also illustrated, which is formed around the pn-transition. In FIG. 1A a state is shown, in which no ESD case is present.

If an ESD case occurs, the current intensity is low in case of a breakthrough, however passes through a steep characteristic curve predetermined by the model in the test in the further ESD event, so that soon after the occurrence of a breakthrough high-current effects become important. In the ESD test according to the human body model the current lies within the range of amperes after a few nanoseconds. As the charge carriers produced by the avalanche effect in the space charge region have to carry current at any time of the HBM pulse, as many charge carriers are produced, so that the space charge region is shifted to the next high-doped area. This is e. g. described in more detail by Yuan Taur et al in "Fundamentals of Modern VLSI Devices", Cambridge University Press, 1998, pp. 320 to 325, and by Betrand G. et al in "Analysis and Compact Modeling of a Vertical Grounded-Base NPN Bipolar Transistor used as an ESD Protection in a Smart Power Technology", IEEE BCTM 1, 2, 2000, pp. 28 to 31.

In FIG. 1B, showing the semiconductor structure from FIG. 1A in the ESD case, this state is illustrated. In FIG. 1B an extended p-area is shown at 110, and as it can be seen, the space charge region is shifted to the transition border from the first layer 102 to the substrate 100.

The above-described effect of the breakthrough leads to the electrical field consequently concentrating on the area between the epitaxy layer 102 and the high-doped substrate 100. At this point the highest fields occur in the further process of the ESD result, so that here the actual ESD event takes place.

Regarding the above-mentioned implementations the disadvantages of the above-described approaches for distributing current in the ESD case become obvious, as it can be seen that the ESD strength can hardly be influenced by technological measures at the surface.

Similar effects as those encountered above using the ESD event with semiconductor structures are also encountered with semiconductor structures which are for example arranged in a power output stage and exposed to overvoltages or current impulses, which may for example result due to transitions on a supply line or due to a faulty adaption of the semiconductor structure.

JP 20000–058870 A describes a semiconductor device of improved ESD strength, wherein the device comprises an n$^+$ substrate, whereon an n⁻ layer is formed, in which an p⁺ well is inserted. US 6,232,822 B1 describes a semiconductor device, particularly a bipolar transistor, wherein a buried n⁺ layer is formed on a p substrate, whereon again an n collector layer is disposed, wherein a base layer is inserted. An emitter layer is formed in the base layer. Starting from a doping in the n collector layer, the n doping gradually rises to the n⁺ doping in the buried layer.

It is the object of the invention to provide a semiconductor structure having an improved ESD and overload strength as well as a method for improving the ESD strength and the overload strength of a semiconductor structure.

In accordance with a first aspect the present invention provides a semiconductor structure having a base layer of a first conductivity type; a first layer of the first conductivity type arranged on the base layer and having a dopant concentration which is lower than a dopant concentration of the base layer; and a second layer of a second conductivity type being operative with the first layer in order to form a junction between the first conductivity type and the second conductivity type; wherein a course of a dopant profile is set step-shaped at the transition between the base layer and the first layer starting from a first dopant concentration in the first layer via a second dopant concentration in the base layer to a third dopant concentration in the base layer, wherein the third dopant concentration is higher than the first dopant concentration and the second dopant concentration, and wherein the second dopant concentration is higher than the first dopant concentration.

In accordance with a second aspect the present invention provides a method for improving the ESD strength and the overload strength of a semiconductor structure, wherein the semiconductor structure comprises a base layer of a first conductivity type, a first layer of the first conductivity type arranged on the base layer and having a dopant concentration which is lower than a dopant concentration of the base layer, and a second layer of a second conductivity type, wherein the first layer and the second layer are operative in order to form a junction between the first conductivity type and the second conductivity type, wherein step-shaped setting a course of the dopant profile at the transition between the base layer and the first layer, starting from a first dopant concentration in the first layer via a second dopant concentration in the base layer to a third dopant concentration in the base layer, wherein the third dopant concentration is higher than the first dopant concentration and the second dopant concentration, and wherein the second dopant concentration is higher than the first dopant concentration.

The present invention provides a method for improving the ESD strength of a semiconductor structure, wherein the semiconductor structure includes a base layer of a first conductivity type, a first layer of the first conductivity type arranged on the base layer and having a dopant concentration which is lower than a dopant concentration of the base layer, and a second layer of a second conductivity type, wherein the first layer and the second layer function together to form a transition between the first conductivity type and the second conductivity type, wherein the method includes the step of setting a course of the dopant profile at the transition between the base layer and the first layer, such, that with in ESD case a space charge region shifted to the transition between the base layer and the first layer reaches into the base layer.

The base layer is a substrate according to one embodiment and a buried layer according to a further embodiment.

The present invention further provides a method for improving the overload strength of a semiconductor structure, wherein the semiconductor structure comprises a base layer of a first conductivity type, a first layer of the first conductivity type arranged on the base layer and having a dopant concentration lower than a dopant concentration of the base layer, and a second layer of a second conductivity type, wherein the first layer and the second layer are operative in order to form a transition between the first conductivity type and the second conductivity type, wherein the method includes the following step:

step-shaped setting of the doping profile at the transition between the base layer and the first layer.

According to one embodiment, the base layer includes a substrate layer and a buffer layer. Preferably the first layer is doped lower than the buffer layer. The first layer is used as an active area of the semiconductor structure. The buffer layer is only loaded with high field strengths in the overload case. In a preferred embodiment, the doping profile proceeds from about $10^{16}$ atoms/cm³ in the area of the first layer over about $10^{17}$ atoms/cm³ to about $10^{18}$ atoms/cm³ in the buffer layer to about $10^{19}$ atoms/cm³ in the area of the substrate layer.

In one embodiment an active collector of a transistor is formed in the first layer, and a base and an emitter of the transistor are formed in the second layer, wherein the transistor may be a power transistor. The transistor may be a bipolar transistor or a field effect transistor. Alternatively, a diode may be formed in the first layer and in the second layer.

The present invention is based on the findings that a distribution of current by measures at the surface of a semiconductor device influences its ESD strength only marginally, as in the ESD case the breakthrough anyway is shifted to the transition of epitaxy layer/substrate and/or epitaxy layer/buried layer—and thus being shifted in the plane. Regarding the above mentioned terminology it is noted that with bipolar transistors produced using IC technologies (IC=integrated circuit) the substrate corresponds to the "buried layer". For simplicity in the course of the following description of the present invention reference is always made to the substrate, wherein the principles of the present invention may also be applicable for IC devices.

Instead of the measures restricted to the surface of the semiconductor structure which only result in a marginal affection of the ESD strength, as was mentioned above, the present invention teaches that an intervention is necessary only in the depth of the semiconductor device, at the transition from the epitaxy layer to the substrate.

As the steepness of a dopant profile at the transition determines the electrical fields occurring there, also the ESD strength is considerably influenced hereby, as far as no other technological shortcomings are present. The slower the dopant profile rises to the substrate, the further the space charge region must reach into the substrate, so that with a constant reverse voltage and/or a constant current a low maximum electrical field is applied and therefore an increased ESD strength is achieved.

According to the present invention between ESD strengths at the pn-transition of between 300 V and 3900 V may be obtained depending on the flatness of the profile at the transition, as it is e. g. formed along the base-collector distance of a high frequency bipolar transistor.

According to a first embodiment of the present invention the effect of a flat dopant profile is reached by subjecting the transition between the epitaxy layer and the substrate to a heat treatment after the growing of the epitaxy layer and if applicable after the formation of further structures, so that the dopant profile is flattened at the transition. With an alternative embodiment the flattening of the profile is reached without a thermal treatment only by an overall implantation into the substrate.

In a further preferred embodiment, the effect of a flat transition is reached by a step-shaped course of the dopant profile.

In the prior art almost nothing was published referring to the topic substrate/ESD strength, wherein in this context reference is made to the publication of Amerasekera A. et al., "ESD in Silicon Integrated Circuits", John Wiley & Sons, 1995, pp. 186 to 188. The great influence of the dopant profile on the ESD strength at the transition from the epitaxy layer to the substrate was not yet detected. It is described, however, that in the ESD case the field is shifted in the direction of the substrate, it was not detected, however, that this area is therefore relevant for ESD-improving interventions. In particular no technological measures are known that could be derived from this detection for increasing the ESD strength. No concrete proposals regarding an ESD-optimized transition from the epitaxy layer to the substrate are known.

According to the present invention it is taught in deviation from the approaches known in the art, to flatten the dopant profile at the transition from the epitaxy layer to the substrate in order to increase the ESD strength.

Experiments carried out in connection with the present invention have shown, that the relatively bad ESD strength of modern technologies may not only be attributed to the results of the capacities steadily becoming smaller with miniaturization, as is often explained, but mainly to the result of the low temperature budget used in the production of semiconductors structures, which leads to steep profiles at the transition from the epitaxy layer to the substrate.

According to the present invention, the profile of the transition from the epitaxy layer to the substrate is flatter than it would be the case with conventional temperature budgets, which are used for the remaining surface-near transitions of the device. According to an embodiment of the present invention, one or more temperatures are used even for the purpose of flattening the dopant profile at the transition form the epitaxy layer to the substrate.

According to a further aspect, the present invention provides a semiconductor structure, wherein the base layer includes a substrate layer and a buffer layer, wherein the doping profile proceeds from about $10^{16}$ atoms/cm$^3$ in the area of the first layer over about $10^{17}$ atoms/cm$^3$ to about 1018 atoms/cm3 in the buffer layer to about $10^{19}$ atoms/cm$^3$ in the area of the substrate layer. In one embodiment an active collector of a transistor is formed in the first layer, and in the second layer a base and an emitter of the transistor are formed, wherein the transistor may be a power transistor. The transistor may be a bipolar transistor or a field effect transistor. Alternatively, a diode is formed in the first layer and in the second layer.

The above described aspect is based on the findings, that the approaches taught above in combination with the ESD case are useable also with power devices for improving the ESD strength of transistors by providing a step-shaped dopant profile, wherein similar effects as in the ESD case occur due to occurring overvoltages at the output of such semiconductor structures.

BRIEF DESCRIPTION OF THE DRAWINGS

Preferred embodiments of the present invention are described in more detail below making reference to the enclosed drawings, in which.

DESCRIPTION OF PREFERRED EMBODIMENTS

Figure 2:
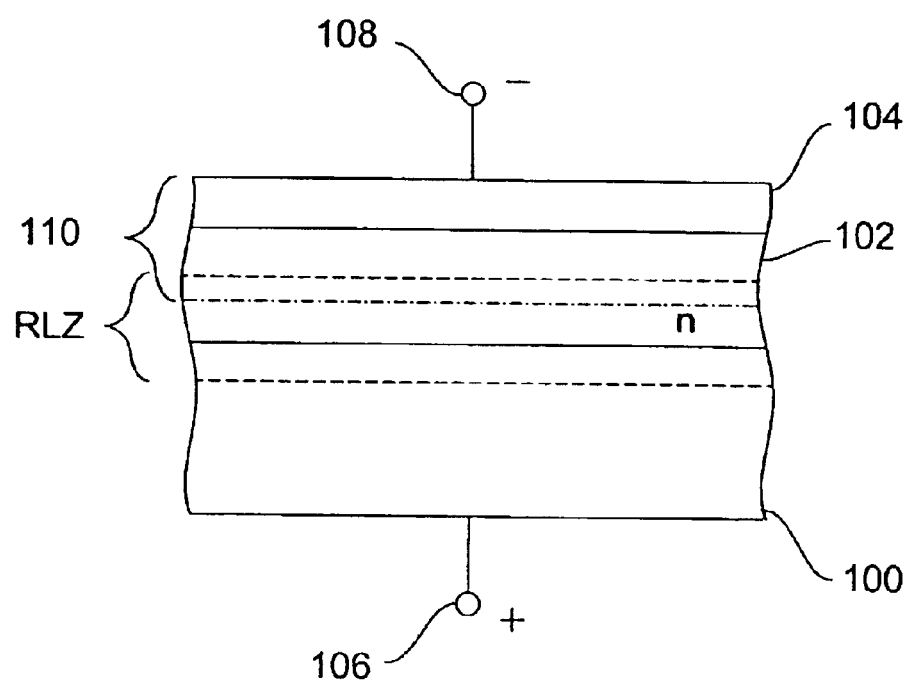
FIG. 2 shows a semiconductor structure according to the present invention in the ESD case.

In FIG. 2 the effect of the inventive flattening of the dopant profile at the transition from the epitaxy layer to the substrate is shown in the ESD case.

Figure 1:
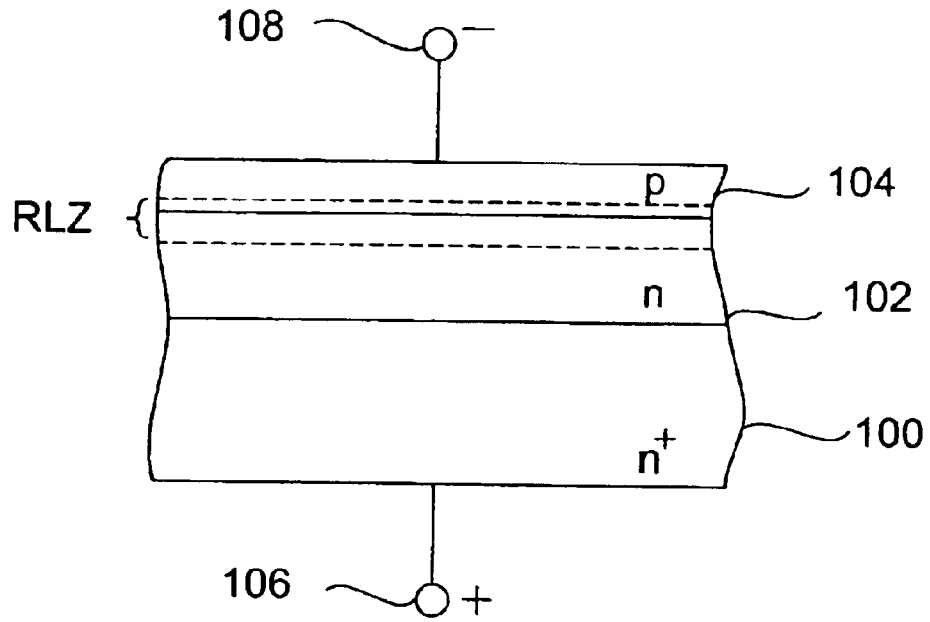
FIG. 1A shows a conventional semiconductor structure having a blocked pn-transition.
FIG. 1B shows the semiconductor structure shown in FIG. 1A in the ESD case.
Figure 1:
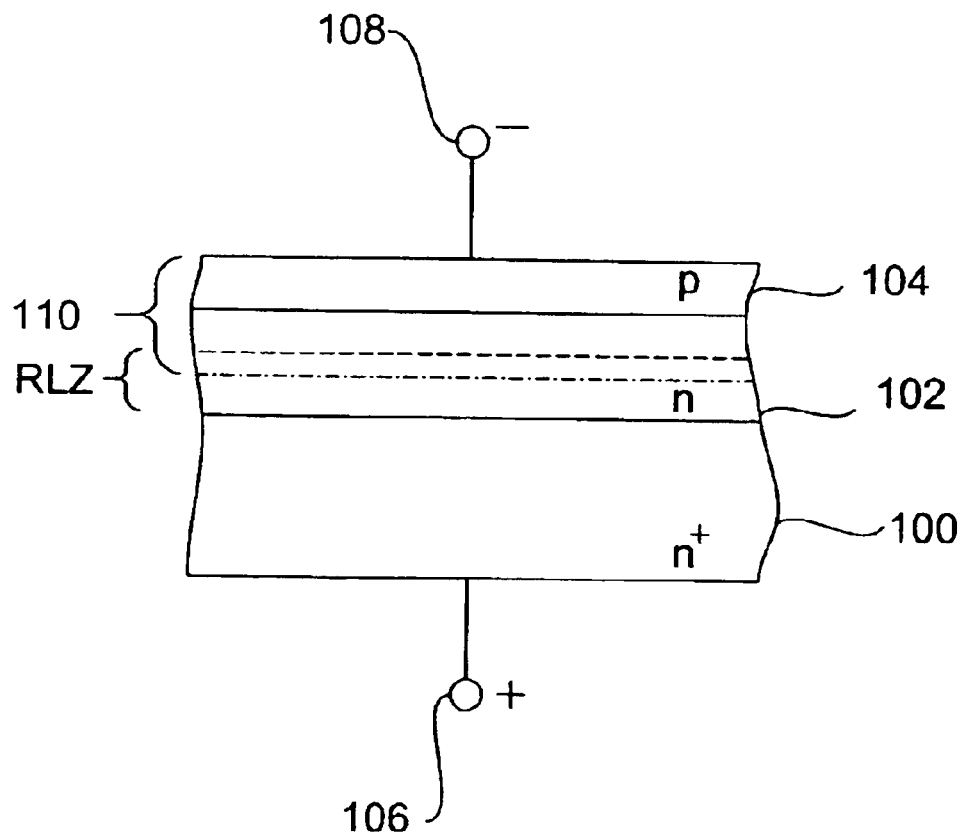

As it can be seen from FIG. 2 in comparison to FIG. 1B, according to the present invention an extension of the space charge region into the substrate 100 is achieved, so that a low maximum electrical field and therefore a higher ESD strength is reached with a constant reverse voltage.

According to the present invention different possibilities exist to change the course of the dopant profile at the transition from the epitaxy layer 102 to the substrate 100 in order to shift the space charge region.

Figure 3:
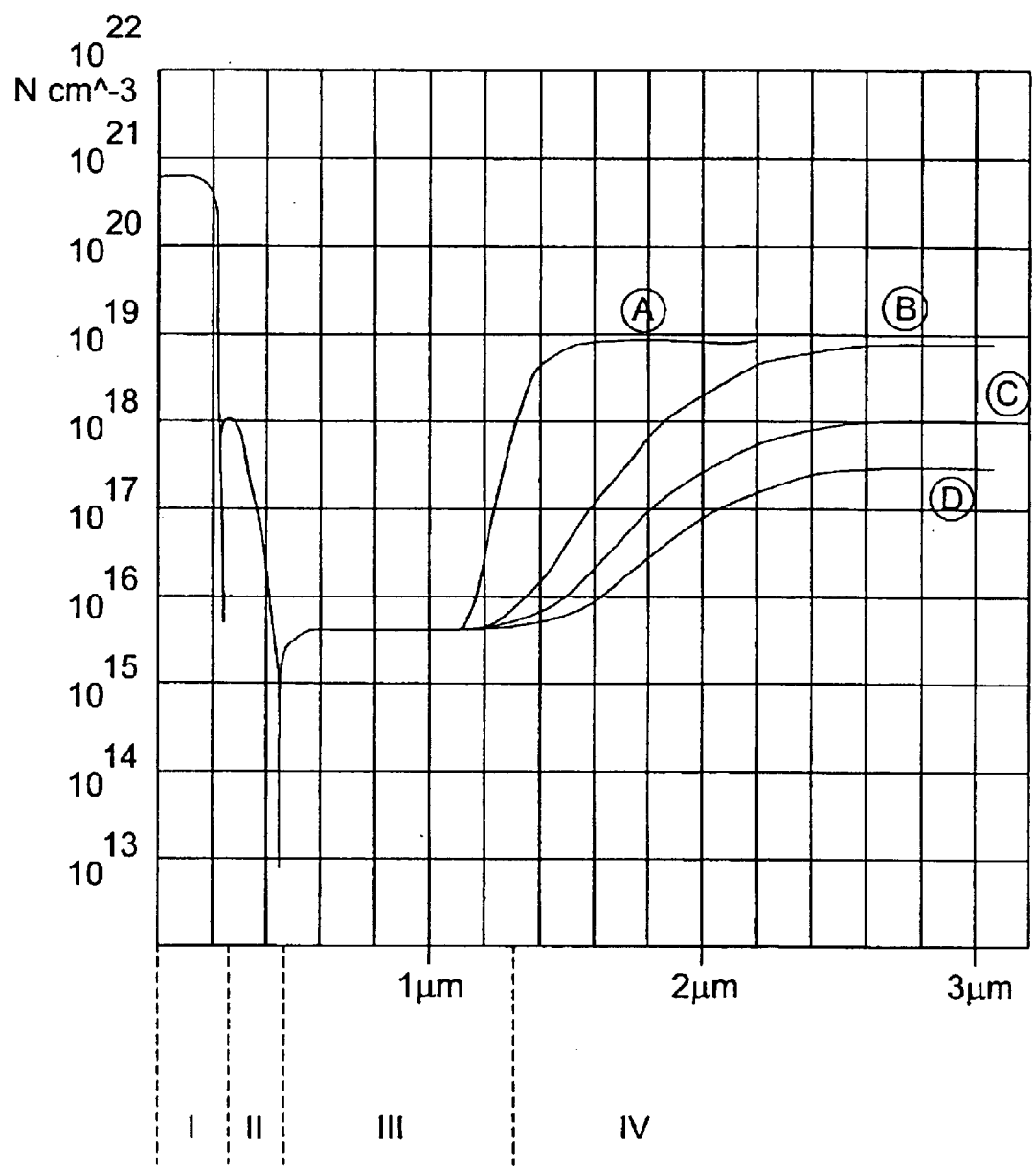
FIG. 3 shows a graph illustrating the dopant profile of the semiconductor structure according to a first embodiment.
Figure 4:
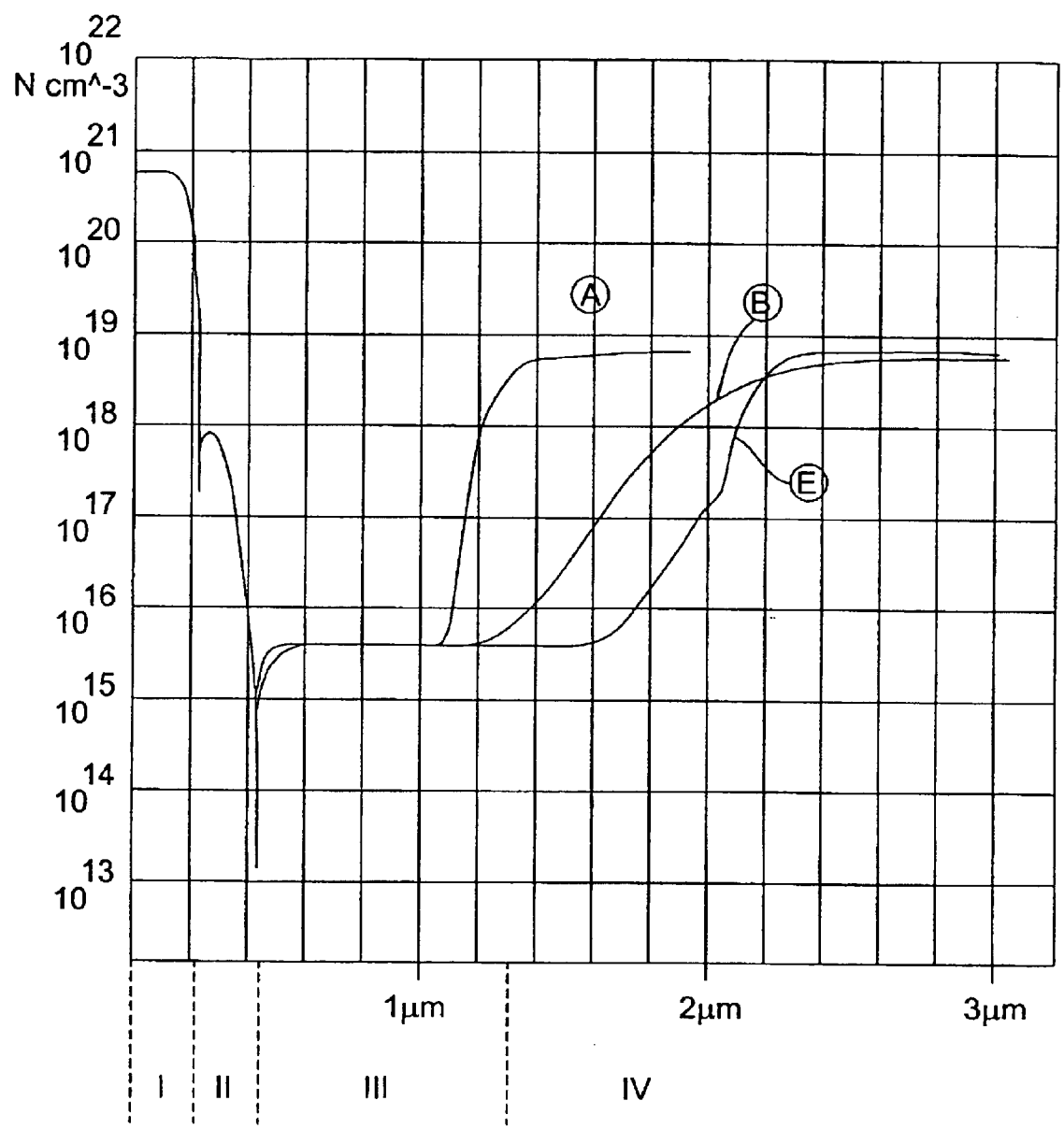
FIG. 4 shows a graph illustrating the dopant profile of the semiconductor structure according to a second embodiment.

According to a first embodiment, the course of the dopant profile at the transition from the epitaxy layer to the substrate is flattened, and two possibilities for such a flattening are explained in more detail referring to FIGS. 3 and 4.

In FIG. 3 the course of the dopant concentration of a high frequency transistor over the distance of a surface of a semiconductor structure is illustrated, wherein this semiconductor structure comprises an n-layer functioning as an n-emitter on the p-layer 104 which is high-doped in addition to the structure shown in FIG. 2. In FIG. 3 four portions I, II, II and IV are shown. Area I shows the dopant course in the area of the above mentioned additional n-layer. Area II shows the course of the p-doping in the p-layer 104. Area III shows the course of the n-doping in the epitaxy layer 102 and area IV shows the course of the n-doping in the area of the substrate. For the matter of the present invention the transition from the area III to the area IV is of interest. A first curve A shows the course of a common semiconductor structure similar to that shown in FIG. 1A with a substrate doped with arsenic (As) and having a resistance of 3 mΩcm. The course of the dopant profile A is very steep, as it results from FIG. 3. Based on the dopant of about $5 \times 10^{15}$ Ncm$^{-3}$ the dopant concentration rises over a length of about 0.5 μm to a high doping in the area of the substrate IV of about $10^{19}$ Ncm$^{-3}$. This steep course of the dopant profile leads to the above described problem with conventional semiconductor structures. The resistance of the substrate preferably lies between 5 mΩcm and 10 mΩcm.

According to a first embodiment of the present invention, the overall temperature budget is lifted during manufacturing the semiconductor structure, wherein there are possibilities given in the process flow during the manufacturing of the semiconductor structure to insert such temperings flawlessly, without the-overall process being influenced disturbingly. The only important thing is that at the time of tempering(s) the epitaxy layer 102 has already grown on the substrate 100. According to an embodiment of the present invention one ESD tempering was inserted into the process after the growing of the field oxide.

In FIG. 3 three embodiments of the present invention are illustrated using the curves B, C and D. Curve B shows the course of the dopant profile for the case of a substrate doped with arsenic (As) having a resistance of 7 mΩcm. The combination of epitaxy layer and substrate was subjected to a heat treatment at a temperature of about 1150° C. for a period of about 60 minutes after the growing of the epitaxy layer on the substrate. This ESD tempering led to the course of the dopant profile shown in FIG. 3 at B. As can be seen, the dopant profile is rising less steep, i. e. flatter compared to curve A. Based on the doping in the epitaxy layer (III) of about $5\times10^{15}$ Ncm$^{-3}$ the doping concentration rises to the final value in the area of the substrate of about $10^{19}$ Ncm$^{-3}$ over a length of about 1.25 μm. The ESD strength that results with a dopant profile according to curve B lies at about 2,700 volts.

Curve B describes the dopant profile with a low-impedance substrate. According to one embodiment of the present invention a high-impedance substrate is used, as the transition with the same temperature budget is the flatter, the higher the impedance of the substrate is. This is shown in FIG. 3 using the curves C and D.

Curve C describes the course of the dopant profile for a substrate doped with antimony (Sb) to have a resistance of about 20 mΩcm, wherein also here the ESD tempering was carried out at a temperature of about 1,150° C. for about 60 minutes. Curve D shows the course of the dopant profile for a substrate doped with antimony, which was subjected to an ESD tempering at 1150° C. for 60 minutes, which however has a resistance of 40 mΩcm in contrast to curve C. As it can be seen, the transition becomes flatter the higher the impedance of the substrate. The ESD strength lies at a doping profile of 3,900 volts according to curve C.

According to a further embodiment of the present invention, a flattening of the dopant profile can also be obtained by an overall implantation into this substrate. The implantation is done before applying the epitaxy layer, preferably using a fast diffusing species, e.g. phosphorous in a substrate doped with arsenic. As only the steepness of the transition is important, the solution in the result is equivalent. In FIG. 4 the doping course in such a situation is illustrated by curve E. For the purpose of comparison curves A and B, which were already described using FIG. 3, are illustrated again. In order to achieve the doping course according to curve E a substrate doped with arsenic was subjected to an implantation instead of the ESD tempering, wherein a substrate doped with arsenic was subjected to an implantation of phosphorous instead of an ESD tempering in the doping course E illustrated in FIG. 4, wherein phosphorous was introduced in the substrate doped with arsenic with a density of $1\times10^{13}$ atoms/cm$^3$ to $1\times10^{14}$/cm$^3$, preferably of $2\times10^{13}$ atoms/cm$^3$ with an implantation energy of 10 KeV. A comparison to curve A shows that also here a flattening of the dopant profile may be achieved.

According to a third embodiment of the present invention, the transition between the epitaxy layer and the substrate is step-shaped regarding the doping course, so that the space charge region abuts at the foot of the step in normal operation of e. g. a transistor. In the ESD case, i.e. in the high current case, this step is flooded and the base charge region only abuts the step further at the back, which extends the space charge region and lowers the maximum field just like the flat transition of the epitaxy layer to the substrate. Regarding the sizing it has to be noted that the step is not flooded with streams in normal operation, in order to prevent an unnecessary deterioration of the parameters of the semiconductor structure, for example of the transistor.

Figure 5:
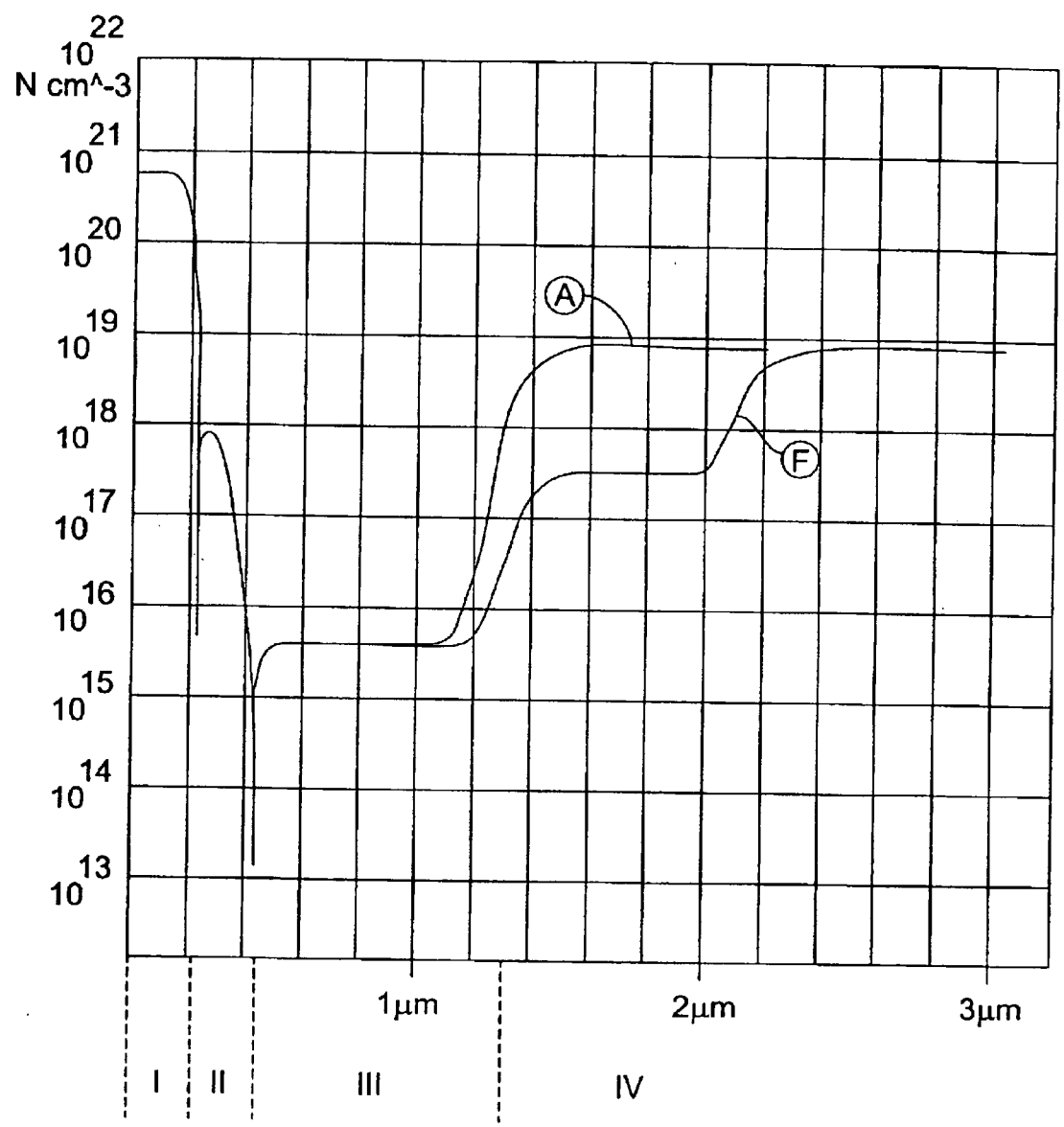
FIG. 5 shows a graph illustrating the dopant profile of the semiconductor structure according to a third embodiment.

In FIG. 5 this step-shaped course of the dopant profile is illustrated in more detail using curve F, wherein curve A described in FIG. 3 is reproduced for purposes of comparison, and which shows the doping course without ESD tempering. As it can be seen, the dopant concentration rises first of all from about $5\times10^{15}$ Ncm$^{-3}$ to about $5\times10^{17}$ Ncm$^{-3}$ on the base of the epitaxy layer. In normal operation the space charge region does not extend into the area of the doping of $5\times10^{17}$ Ncm$^{-3}$. Based on this doping the doping concentration further rises to the final concentration of $5\times10^{19}$ Ncm$^{-3}$, and in the ESD case the space charge region can extend further into the substrate due to the step, that is in the area in which the doping is $5\times10^{17}$ Ncm$^{-3}$.

As it becomes clear from the above explanation, the flatter doping profile need not necessarily be produced at the transition from the epitaxy layer to the substrate by ESD temperings, but on the contrary the above described substrate implant or the step-shaped profile course may be chosen. The substrate implant represents an interesting alternative to ESD tempering, as it can be introduced locally using photo technology. The mechanisms for flattening the doping profile at the transition from the epitaxy layer to the substrate described referring to FIGS. 3 and 4 may among others deteriorate some parameters of the semiconductor element, like e.g. C(u), wherein no deterioration occurs in a way that the measures can not be used any more.

Compared to this the "step epitaxy" (see FIG. 5) is very interesting, as the transistor properties or the properties of the semiconductor device are not changed during normal operation with a suitable selection of the step height.

The above-described improvement of the ESD strength using a step epitaxy may be regarded as a buffer layer between the substrate and the active collector of the RF transistor in RF transistors. A step epitaxy formed by the buffer layer is also very advantageous when using the semiconductor structure in power output stages, for example for the global system for mobile communication (GSM, UMTS, etc.). With these applications the most important thing is, that the device resists overvoltages and a current overload without destructions at its output or at the output of an output stage. Such overvoltages may result as transitions on the supply line or through a faulty adaption in the RF range. This case of load is similar to the ESD event, and consequently the same measures for stabilization are operating here.

In a further embodiment of the present invention a semiconductor structure is created, wherein the base layer IV includes a substrate layer and a buffer layer, wherein the doping profile F (see FIG. 5) proceeds from about $10^{16}$ atoms/cm$^3$ in the area of the first layer III over about $10^{17}$ atoms/cm$^3$ to about $10^{18}$ atoms/cm$^3$ in the buffer layer (area IV to 2 μm in FIG. 5) to about $10^{19}$ atoms/cm$^3$ in the area of the substrate layer (area IV from 2 μm in FIG. 5).

The semiconductor structure may be a transistor or a diode. If the semiconductor structure is a transistor, an active collector (see area III in FIG. 5) is formed in the first layer (see FIG. 2), and a base (see area II in FIG. 5) and an emitter (see area I in FIG. 5) are formed in the second layer (see FIG. 2). The transistor may be formed as a power transistor and as a bipolar transistor or as a field effect transistor.

When producing such a semiconductor structure having an improved overvoltage strength, as it is for example used in a GSM power output stage, it is not possible to deposit the buffer layer or the buffer stage in the required doping height homogenously epitactic due to the difference to and/or interaction with other devices.

Therefore, first of all an undoped or a low-doped buffer layer is deposited on the provided substrate layer having a doping of preferably between undoped to about $10^{17}$ atoms/cm$^3$ according to the invention, and the step-shaped doping profile is created by a local implantation of dopants under the transistor that is to be formed or under the diode that is to be formed. Finally, the first layer 102 and the second layer 104 are deposited, and the transistor or the diode is created.

The doping of the buffer layer is of the same or the opposite type as the substrate layer. The creation of the step-shaped dopant profile by the local implantation in the buffer layer causes a doping of the first conductivity type in the range of about $10^{17}$ atoms/cm$^3$ to about $10^{18}$ atoms/cm$^3$.

Although the second layer 104 was described as being deposited on the first layer, the present invention is not restricted to this. According to the present invention, the second layer may also be formed by areas formed in the first layer 102, e.g. active areas for the device (base, emitter). In this case, the second layer 104 is e.g. formed by a creation of wells in the first layer, e.g. by an implantation.

Although the preferred embodiments of the present invention were described using a structure comprising an n-substrate, an n-epitaxy layer and a p-layer, the present invention is not restricted to such a semiconductor structure. On the contrary, the findings of the present invention may also be used with structures having a p-epitaxy layer on a p-substrate, wherein an n-layer is applied to a p-epitaxy layer.

The present invention is not limited to the above mentioned dopants, but rather any other suitable dopants may also be used.

While, this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor structure comprising:
    a base layer of a first conductivity type;
    a first layer of the first conductivity type arranged on the base layer and having a dopant concentration which is lower than a dopant concentration of the base layer; and
    a second layer of a second conductivity type being operative with the first layer in order to form a junction between the first conductivity type and the second conductivity type;
    wherein a course of a dopant profile is set step-shaped at the transition between the base layer and the first layer starting from a first dopant concentration in the first layer via a second dopant concentration in the base layer to a third dopant concentration in the base layer, wherein the third dopant concentration is higher than the first dopant concentration and the second dopant concentration, and wherein the second dopant concentration is higher than the first dopant concentration, and wherein the first dopant concentration is $10^{16}$ atoms/cm$^3$, the second dopant concentration is $10^{17}$ atoms/cm$^3$ and the third dopant concentration is $10^{19}$ atoms/cm$^3$.

2. The semiconductor structure according claim 1, wherein the base layer is a substrate or a buried layer.

3. The semiconductor structure according to claim 1, wherein the base layer includes a substrate layer and a buffer layer, wherein the doping profile proceeds starting from $10^{16}$ atoms/cm$^3$ in the area of the first layer via $10^{17}$ atoms/cm$^3$ to $10^{18}$ atoms/cm$^3$ in the buffer layer in the base layer to $10^{19}$ atoms/cm$^3$ in the area of the substrate layer in the base layer.

4. The semiconductor structure according to claim 3, wherein an active collector of a transistor is formed in the first layer, and wherein a base and an emitter of the transistor are formed in the second layer.

5. The semiconductor structure according to claim 4, wherein the transistor is a power transistor.

6. The semiconductor structure according to claim 4, wherein the transistor is a bipolar transistor or a field effect transistor.

7. A semiconductor structure comprising:
    a base layer of a first conductivity type;
    a first layer of the first conductivity type arranged on the base layer and having a dopant concentration which is lower than a dopant concentration of the base layer; and
    a second layer of a second conductivity type being operative with the first layer in order to form a junction between the first conductivity type and the second conductivity type;
    wherein a course of a dopant profile is set step-shaped at the transition between the base layer and the first layer starting from a first dopant concentration in the first layer via a second dopant concentration in the base layer to a third dopant concentration in the base layer, wherein the third dopant concentration is higher than the first dopant concentration and the second dopant concentration, and wherein the second dopant concentration is higher than the first dopant concentration;
    wherein the base layer is a substrate or a buried layer, and wherein a diode is formed in the first layer and in the second layer.

8. A method for improving the ESD strength and the overload strength of a semiconductor structure, wherein the semiconductor structure comprises a base layer of a first conductivity type, a first layer of the first conductivity type arranged on the base layer and having a dopant concentration which is lower than a dopant concentration of the base layer, and a second layer of a second conductivity type, wherein the first layer and the second layer are operative in order to form a junction between the first conductivity type and the second conductivity type, comprising step-shaped setting a course of the dopant profile at the transition between the base layer and the first layer, starting from a first dopant concentration in the first layer via a second dopant concentration in the base layer to a third dopant concentration in the base layer, wherein the third dopant concentration is higher than the first dopant concentration and the second dopant concentration, and wherein the second dopant concentration is higher than the first dopant concentration, and wherein the first dopant concentration is $10^{16}$ atoms/cm$^3$, the second dopant concentration is $10^{17}$/cm$^3$ and the third dopant concentration is $10^{19}$ atoms/cm$^3$.

9. The method according to claim 8, wherein the base layer is a substrate or a buried layer.

10. The method according to claim 8, wherein the base layer includes a substrate layer and a buffer layer, wherein the doping profile proceeds from $10^{16}$ atoms/cm$^3$ in the area of the first layer via $10^{17}$ atoms/cm$^3$ to $10^{18}$ atoms/cm$^3$ in the buffer layer in the base layer to $10^{19}$ atoms/cm$^3$ in the area of the substrate layer in the base layer.

11. The method according to claim 10, wherein the area of the first layer forms an active collector of a transistor, and wherein a base and an emitter of the transistor are formed in the second layer, wherein the second layer is deposited on the first layer or formed by inserted areas in the first layer.

12. The method according to claim 11, wherein the transistor is a power transistor.

13. The method according to claim 11, wherein the transistor is a bipolar transistor or a field effect transistor.

14. The method according to claim 10, wherein a diode is formed in the first layer and in the second layer.

15. The method according to claim 11, comprising the following steps:
   providing the substrate layer of the base layer;
   forming a buffer layer on the substrate layer of the base layer, wherein the buffer layer has no doping or a very low doping;
   forming the step-shaped doping profile by a local implantation of dopants under the transistor to be formed or the diode to be formed;
   forming the first layer on the buffer layer;
   forming the second layer by depositing the second layer on the first layer or by creating active areas in the first layer; and
   forming the transistor or the diode.

16. The method according to claim 15, wherein the doping of the buffer layer is of the first conductivity type or of the second conductivity type, and wherein a doping of the first conductivity type in the range of about $10^{17}$ atoms/cm$^3$ to about $10^{18}$ atoms/cm$^3$ is reached by a local implantation in the buffer layer in the step of forming the step-shaped doping profile.

17. The method according to claim 15, wherein the creation of the transistor includes the formation of the base and the emitter, the first layer being operative as a collector.

18. The semiconductor structure according to claim 7 wherein the first dopant concentration is $10^{16}$ atoms/cm$^3$, the second dopant concentration is $10^{17}$ Atoms/cm$^3$ and the third dopant concentration is $10^{19}$ atoms/cm$^3$.

* * * * *